United States Patent
Li et al.

(10) Patent No.: US 10,209,298 B2
(45) Date of Patent: Feb. 19, 2019

(54) DELAY MEASUREMENT CIRCUIT AND MEASURING METHOD THEREOF

(71) Applicant: National Central University, Taoyuan (TW)

(72) Inventors: Jin-Fu Li, Taoyuan (TW); Han-Yu Wu, Taipei (TW); Che-Wei Chou, Yunlin County (TW); Yong-Xiao Chen, New Taipei (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 15/219,290

(22) Filed: Jul. 26, 2016

(65) Prior Publication Data
US 2017/0343602 A1    Nov. 30, 2017

(30) Foreign Application Priority Data

May 24, 2016  (TW) .............................. 105116063 A

(51) Int. Cl.
*G01R 31/28*       (2006.01)
*G01R 31/317*      (2006.01)
*G01R 31/3193*     (2006.01)

(52) U.S. Cl.
CPC ... *G01R 31/2882* (2013.01); *G01R 31/31725* (2013.01); *G01R 31/31937* (2013.01)

(58) Field of Classification Search
CPC ........ G01R 31/31725; G01R 31/31922; G01R 31/2882; G01R 31/11; G01R 31/31937

(Continued)

(56) References Cited

U.S. PATENT DOCUMENTS 7,398,412 B2 *  7/2008  Gomm ................ G06F 13/4234
                                              327/141
7,423,466 B2 *  9/2008  Sareen ..................... H03L 7/08
                                              327/158

(Continued)

FOREIGN PATENT DOCUMENTS

TW        I456706      10/2014
TW      201602601       1/2016

OTHER PUBLICATIONS

Jain et al., "On-chip delay measurement circuit," 2012 17th IEEE European Test Symposium (ETS), May 28-31, 2012, pp. 1-6.

(Continued)

*Primary Examiner* — Christopher P McAndrew
(74) *Attorney, Agent, or Firm* — JCIPRNET

(57) ABSTRACT

A delay measurement circuit includes a transporting path selector, first and second delay measurement devices, and a controller. The delay measurement circuit forms a plurality of transporting loops through two of a first reference transporting conductive wire, a second reference transporting conductive wire, and a tested transporting conductive wire according to a control signal. The first delay measurement device respectively measures part of the transporting loops to obtain a plurality first transporting delays. The second delay measurement device respectively measures part of the transporting loops to obtain a plurality second transporting delays. The controller generates the control signal, and obtains a transporting delay of the tested transporting conductive wire according to the first transporting delays and the second transporting delays.

8 Claims, 6 Drawing Sheets

(58) Field of Classification Search
USPC .......................................................... 324/617
See application file for complete search history.

(56) References Cited

U.S. PATENT DOCUMENTS

| | | | | |
|---|---|---|---|---|
| 7,816,960 | B2* | 10/2010 | Saint-Laurent | H03L 7/00 327/153 |
| 8,248,136 | B1* | 8/2012 | Zhang | H03K 5/131 327/262 |
| 2006/0250169 | A1* | 11/2006 | Sareen | H03L 7/08 327/156 |
| 2008/0054965 | A1* | 3/2008 | Arai | G11C 7/22 327/158 |
| 2009/0039867 | A1* | 2/2009 | Saint-Laurent | G04F 10/005 324/102 |
| 2011/0249483 | A1* | 10/2011 | Oh | G11C 7/10 365/63 |
| 2012/0025846 | A1* | 2/2012 | Minas | G01R 31/2853 324/606 |
| 2015/0145581 | A1* | 5/2015 | Palmer | H03K 5/131 327/262 |
| 2016/0027486 | A1* | 1/2016 | Eckel | G11C 7/222 365/189.07 |

OTHER PUBLICATIONS

Dudek et al., "A high-resolution CMOS time-to-digital converter utilizing a Vernier delay line," IEEE Journal of Solid-State Circuits, Feb. 2000, pp. 240-247.

Levine et al., "A high-resolution flash time-to-digital converter and calibration scheme," proceedings of International Test Conference, Oct. 26-28, 2004, pp. 1148-1157.

Tayade et al., "On-chip Programmable Capture for Accurate Path Delay Test and Characterization," 2008 IEEE International Test Conference, Oct. 28-30, 2008, pp. 1-10.

Maneatis et al., "Precise delay generation using coupled oscillators," IEEE Journal of Solid-State Circuits, Dec. 1993, pp. 1273-1282.

Hsiao et al., "A built-in parametric timing measurement unit," IEEE Design & Test of Computers, Jul.-Aug. 2004, pp. 322-330.

Ghosh et al., "A Novel Delay Fault Testing Methodology Using Low-Overhead Built-In Delay Sensor," IEEE Transactions on Computer-Aided Design of Integrated Circuits and Systems, Dec. 2006, pp. 2934-2943.

Zhang et al., "On-Chip Measurement System for Within-Die Delay Variation of Individual Standard Cells in 65-nm CMOS," IEEE Transactions on Very Large Scale Integration (VLSI) Systems, Oct. 2011, pp. 1876-1880.

You et al., "Performance Characterization of TSV in 3D IC via Sensitivity Analysis," 19th IEEE Asian Test Symposium, Dec. 1-4, 2010, pp. 389-394.

You et al., "In-Situ Method for TSV Delay Testing and Characterization Using Input Sensitivity Analysis," IEEE Transactions on Very Large Scale Integration (VLSI) Systems, Mar. 8, 2013, pp. 443-453.

Huang et al., "Small delay testing for TSVs in 3-D ICs," 49th ACM/EDAC/IEEE Design Automation Conference (DAC), Jun. 3-7, 2012, pp. 1031-1036.

Rodríguez-Montañés et al., " Post-bond test of Through-Silicon Vias with open defects," 19th IEEE European Test Symposium (ETS), May 26-30, 2014, pp. 1-6.

Wu et al., "A Built-In Method for Measuring the Delay of TSVs in 3D ICs," 21st IEEE European Test Symposium, May 23-27, 2016, pp. 1-6.

* cited by examiner

DELAY MEASUREMENT CIRCUIT AND MEASURING METHOD THEREOF

CROSS-REFERENCE TO RELATED APPLICATION

This application claims the priority benefit of Taiwan application serial no. 105116063, filed on May 24, 2016. The entirety of the above-mentioned patent application is hereby incorporated by reference herein and made a part of this specification.

BACKGROUND OF THE INVENTION

Field of the Invention

The invention relates to a delay measurement circuit and a measuring method thereof, and particularly relates to a delay measurement circuit used for measuring transporting conductive wires between chips and a measuring method thereof.

Description of Related Art

In conventional technical field, delay measurement circuits are roughly divided into three types including vernier delay line, ring oscillator and time to voltage converter. Although the measuring method of the vernier delay line may provide a better resolution, when delay measurement of a larger range is performed, a required circuit area is greatly increased. In a delay measuring operation of the ring oscillator, a measuring resolution thereof is limited by a structure of the ring oscillator. Moreover, the measuring method of the time to voltage converter is uneasy to implement calibration and is liable to be influenced by a manufacturing process variation.

Measurement of delay of transporting conductive wires between chips is usually implemented by using the ring oscillator. Besides that the structure of the ring oscillator may influence a measuring resolution, the vector (logic 0 transited to logic 1, or logic 1 transited to logic 0) that causes an error of the measured delay cannot be confirmed, which causes difficulty in analysis.

SUMMARY OF THE INVENTION

The invention is directed to a delay measurement circuit and a measuring method thereof, which are capable of providing a high resolution in case that a circuit with a low area is used.

The invention provides a delay measurement circuit including a transporting path selector, a first delay measurement device, a second delay measurement device, and a controller. The transporting path selector is coupled to a plurality of transporting conductive wires, and selects a first reference transporting conductive wire, a second reference transporting conductive wire and a tested transporting conductive wire in the transporting conductive wires. The transporting path selector forms a plurality of transporting loops through two of the first reference transporting conductive wire, the second reference transporting conductive wire and the tested transporting conductive wire according to a control signal. The first delay measurement device is coupled to one end of the transporting path selector, and respectively calculates transporting delays of a part of the transporting loops to obtain a plurality of first transporting delays. The second delay measurement device is coupled to another end of the transporting path selector, and respectively calculates transporting delays of a part of the transporting loops to obtain a plurality of second transporting delays. The controller is coupled to the transporting path selector, the first delay measurement device and the second delay measurement device, and generates the control signal, and obtains a transporting delay of the tested transporting conductive wire according to the first transporting delays and the second transporting delays.

In an embodiment of the invention, a first transporting loop is through the first reference transporting conductive wire and the second reference transporting conductive wire, a second transporting loop is through the first reference transporting conductive wire and the tested transporting conductive wire, and a third transporting loop is through the second reference transporting conductive wire and the tested transporting conductive wire. The first delay measurement device detects transporting delays of the first transporting loop and the second transporting loop to respectively obtain the first transporting delays T0 and T2. The second delay measurement device detects transporting delays of the first transporting loop and the third transporting loop to respectively obtain the second transporting delays T1 and T3. The controller performs an arithmetic operation to obtain the transporting delay of the tested transporting conductive wire according to the first transporting delays T0 and T2 and the second transporting delays T1 and T3, where the transporting delay of the tested transporting conductive wire=(T2+T3−T4)/2, T4 is an average of T0 and T1.

In an embodiment of the invention, the transporting path selector includes a plurality of first switches and a plurality of second switches, where the first switches are respectively coupled to first ends of the transporting conductive wires, and the second switches are respectively coupled to second ends of the transporting conductive wires.

In an embodiment of the invention, the first ends of the transporting conductive wires are coupled to a first chip, the second ends of the transporting conductive wires are coupled to a second chip, the first switches are configured in the first chip, and the second switches are configured in the second chip.

In an embodiment of the invention, the first delay measurement device is configured in the first chip or the second chip, and the second delay measurement device is configured in the first chip or the second chip.

In an embodiment of the invention, one of the first delay measurement device and the second delay measurement device includes a plurality of first buffers, a plurality of second buffers and a plurality of flip-flops. The first buffers are coupled to each other in series, and receive an tested signal through each of the transporting loops to generate a plurality of delayed tested signals. The second buffers are coupled to each other in series, and receive a reference signal to generate a plurality of delayed reference signals. The flip-flops respectively receive the delayed tested signals and the delayed reference signals. The flip-flops respectively sample the delayed tested signals according to the delayed reference signals to generate the transporting delay of each of the transporting loops.

In an embodiment of the invention, one of the first delay measurement device and the second delay measurement device includes a plurality of first buffers, a plurality of second buffers, a multiplexer and a flip-flop. The first buffers are coupled to each other in series, and receive an tested signal through each of the transporting loops to generate a plurality of delayed tested signals. The second buffers are coupled to each other in series, and receive a reference signal to generate a plurality of delayed reference signals. The multiplexer receives the delayed tested signals and the delayed reference signals, and sequentially selects each of the delayed tested signals and the corresponding delayed reference signal according to a selection signal to respectively generate a selected delayed tested signal and a selected delayed reference signal. The flip-flop sequentially samples the selected delayed tested signal according to the selected delayed reference signal to obtain the transporting delay of each of the transporting loops.

In an embodiment of the invention, one of the first delay measurement device and the second delay measurement device includes a plurality of first coarse buffers, a plurality of second coarse buffers, a first multiplexer, a plurality of first fine buffers, a plurality of second fine buffers, a second multiplexer and a flip-flop. The first coarse buffers are coupled to each other in series, and receive an tested signal through each of the transporting loops to generate a plurality of coarse delayed tested signals. The second coarse buffers are coupled to each other in series, and receive a reference signal to generate a plurality of coarse delayed reference signals. The first multiplexer receives the coarse delayed tested signals and the coarse delayed reference signals, and sequentially selects each of the coarse delayed tested signals and the corresponding coarse delayed reference signal according to a first selection signal to respectively generate a selected delayed tested signal and a selected delayed reference signal. The first fine buffers are coupled to each other in series, and receive the selected delayed tested signal to generate a plurality of fine delayed tested signals. The second fine buffers are coupled to each other in series, and receive the selected delayed reference signal to generate a plurality of fine delayed reference signals. The second multiplexer receives the fine delayed tested signals and the fine delayed reference signals, and sequentially selects each of the fine delayed tested signals and the corresponding fine delayed reference signal according to a second selection signal to respectively generate an output delayed tested signal and an output delayed reference signal. The flip-flop sequentially samples the output delayed tested signal according to the output delayed reference signal to obtain the transporting delay of each of the transporting loops.

In an embodiment of the invention, a delay amount of each of the first fine buffers is smaller than a delay amount of each of the first coarse buffers, and a delay amount of each of the second fine buffers is smaller than a delay amount of each of the second coarse buffers.

In an embodiment of the invention, each of the transporting conductive wires is a bonding wire.

In an embodiment of the invention, each of the transporting conductive wires is a through silicon via.

The invention provides a measuring method of delay of transporting conductive wires, where the transporting conductive wires are connected to a first chip and a second chip, the measuring method includes following steps. A first reference transporting conductive wire, a second reference transporting conductive wire and a tested transporting conductive wire in the transporting conductive wires are selected. A plurality of transporting loops through two of the first reference transporting conductive wire, the second reference transporting conductive wire and the tested transporting conductive wire is formed according to a control signal. A first delay measurement device is provided to respectively calculate transporting delays of a part of the transporting loops to obtain a plurality of first transporting delays. A second delay measurement device is provided to respectively calculate transporting delays of a part of the transporting loops to obtain a plurality of second transporting delays. A transporting delay of the tested transporting conductive wire is obtained according to the first transporting delays and the second transporting delays.

According to the above description, in the invention, two delay measurement devices are adopted to measure the transporting delays of a plurality of transporting loops, and an arithmetic operation is performed to the obtained transporting delays to counteract an error probably caused by a manufacturing process variation, so as to improve measurement accuracy. Moreover, by using the delay measurement devices of different structures, a resolution of delay measurement is improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
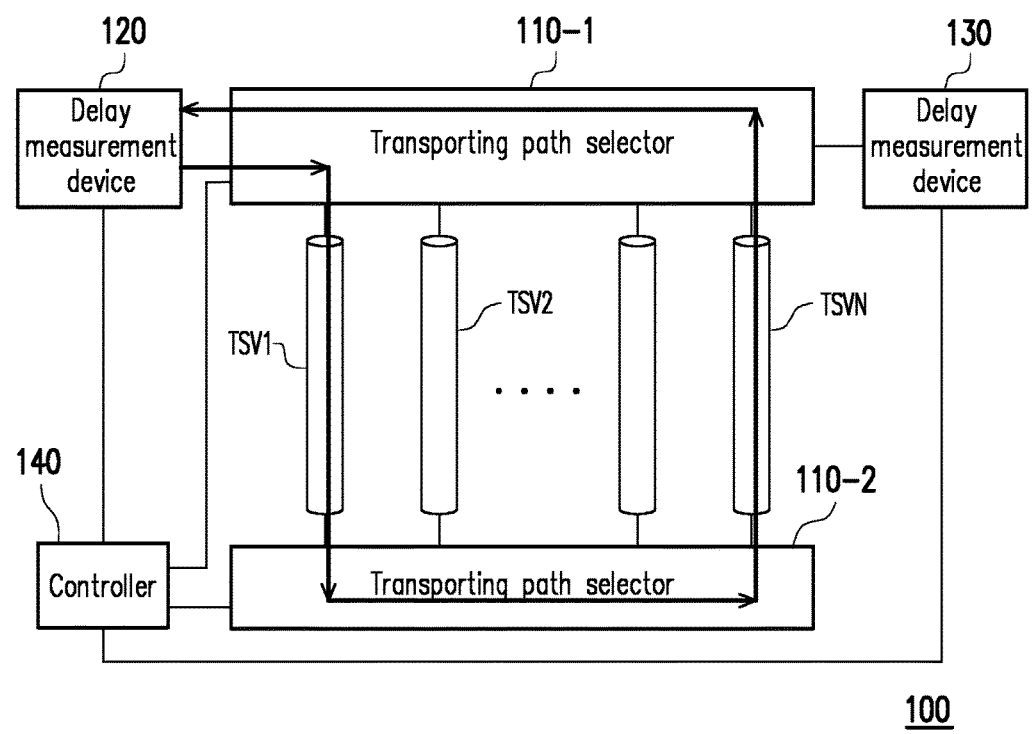
FIG. 1A to FIG. 1C are schematic diagrams of delay measurement circuits according to embodiments of the invention.
Figure 1B:
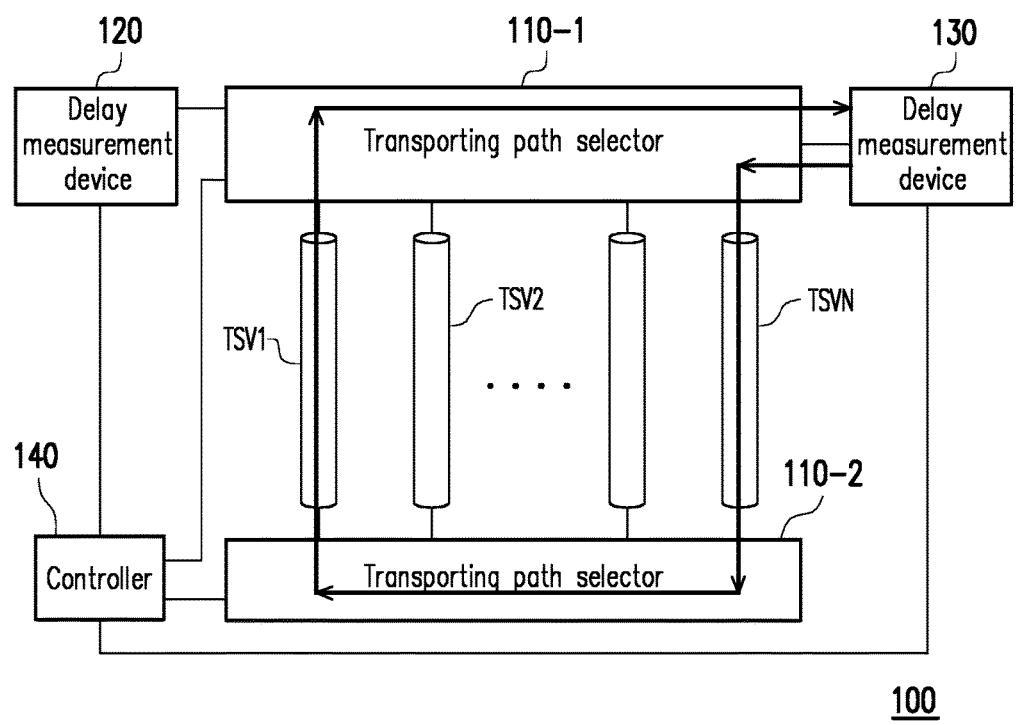
Figure 1C:
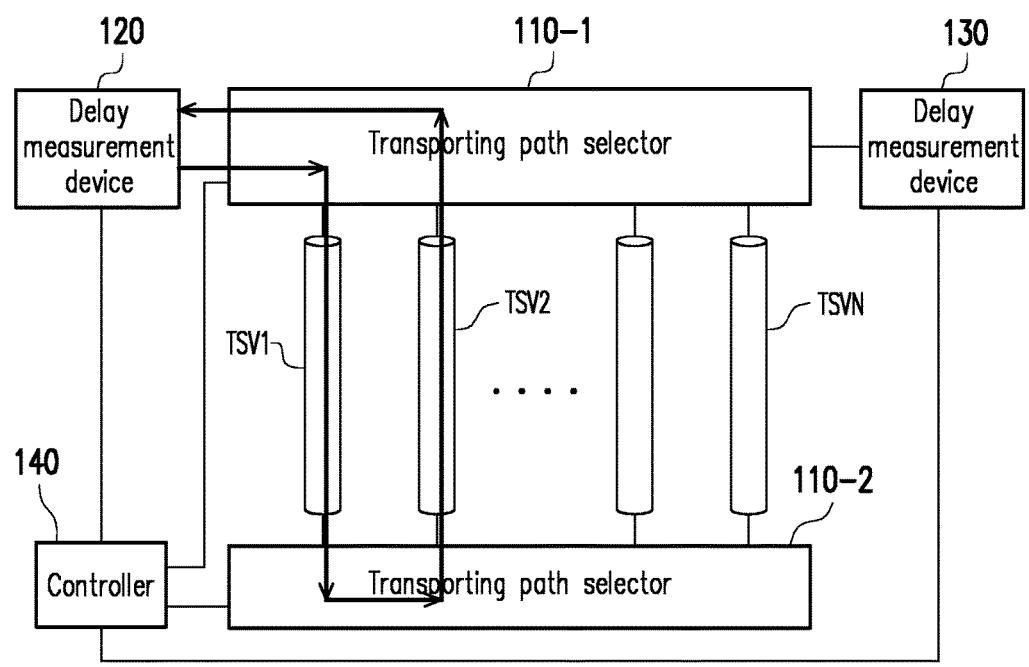

Referring to FIG. 1A to FIG. 1C, the delay measurement circuit 100 includes transporting path selectors 110-1 and 110-2, delay measurement devices 120 and 130 and a controller 140. The transporting path selectors 110-1 and 110-2 are coupled to transporting conductive wires TSV1-TSVN, where the transporting path selector 110-1 is coupled to first ends of the transporting conductive wires TSV1-TSVN, and the transporting path selector 110-2 is coupled to second ends of the transporting conductive wires TSV1-TSVN. The delay measurement device 120 is coupled to one of the transporting path selectors 110-1 and 110-2, and the delay measurement device 130 is coupled to one of the transporting path selectors 110-1 and 110-2. Moreover, in FIG. 1A to FIG. 1C, the delay measurement device 120 is coupled to an end of the transporting path selector 110-1 close to the transporting conductive wire TSV1, and the delay measurement device 130 is coupled to an end of the transporting path selector 110-1 close to the transporting conductive wire TSVN. Moreover, the controller 140 is coupled to the delay measurement devices 120 and 130 and the transporting path selectors 110-1 and 110-2.

In view of an operation detail, the transporting path selectors 110-1 and 110-2 may form different transporting loops by changing a connection relationship between the transporting conductive wires TSV1-TSVN according to a control signal. The delay measurement devices 120 and 130 may measure transporting delays of the different transporting loops. Further, when measuring the transporting delays of the different transporting loops, reference transporting conductive wires and a tested transporting conductive wire are selected from the transporting conductive wires TSV1-TSVN. For example, in the case of FIG. 1A, a transporting loop is shown to pass through a first reference transporting conductive wire (e.g., TSV1) and a second reference transporting conductive wire (e.g., TSVN). In the case of FIG. 1B, a transporting loop is shown to pass through a first reference transporting conductive wire (e.g., TSVN) and a tested transporting conductive wire (e.g., TSV1). In the case of FIG. 1C, a transporting loop is shown to pass through a second reference transporting conductive wire (e.g., TSV1) and a tested transporting conductive wire (e.g., TSV2). The transporting path selectors 110-1 and 110-2 may generate four transporting loops according to the control signal, which are respectively a transporting loop A (FIG. 1A): the delay measurement device 120→the transporting conductive wire TSV1→the transporting path selector 110-2→the transporting conductive wire TSV1→the transporting path selector 110-1→the delay measurement device 120; a transporting loop B: (FIG. 1B) the delay measurement device 130→the transporting conductive wire TSV1→the transporting path selector 110-2→the transporting conductive wire TSV1→the transporting path selector 110-1→the delay measurement device 130; a transporting loop C (FIG. 1C): the delay measurement device 120→the transporting conductive wire TSV1→a first part of the transporting path selector 110-2→the transporting conductive wire TSV2→a first part of the transporting path selector 110-1→the delay measurement device 120; and a transporting loop D: the delay measurement device 130→the transporting conductive wire TSVN→a second part of the transporting path selector 110-2→the transporting conductive wire TSV2→a second part of the transporting path selector 110-1→the delay measurement device 130, where the control signal can be provided by the controller 140.

It is assumed that a transporting delay of the transporting conductive wire TSV1 is Tref1, a transporting delay of the transporting conductive wire TSVN is Tref2, a transporting delay of the transporting path selector 110-1 is Tw0, and a transporting delay of the transporting path selector 110-2 is Tw1 Moreover, the transporting delay Tw0 of the transporting path selector 110-1 is equal to a transporting delay Tw2 of the first part of the transporting path selector 110-1 plus a transporting delay Tw3 of the second part of the transporting path selector 110-1, and the transporting delay Tw1 of the transporting path selector 110-2 is equal to a transporting delay Tw4 of the first part of the transporting path selector 110-2 plus a transporting delay Tw5 of the second part of the transporting path selector 110-2, and a transporting delay of the tested transporting conductive wire (the transporting conductive wire TSV2) is Ttsv2. In this way, the delay measurement devices 120 and 130 may obtain following equations by measuring the above transporting loop A-the transporting loop D:

$$\text{Transporting delay } T0 = Tref1 + Tw0 + Tref2 + Tw1 \quad (1)$$

$$\text{Transporting delay } T1 = Tref2 + Tw0 + Tref1 + Tw1 \quad (2)$$

$$\text{Transporting delay } T2 = Tref1 + Tw2 + Ttsv2 + Tw3 \quad (3)$$

$$\text{Transporting delay } T3 = Ttsv2 + Tw4 + Tref2 + Tw5 \quad (4)$$

In the present embodiment, the transporting delays T0 and T2 can be obtained by the delay measurement device 120, and the transporting delays T1 and T3 can be obtained by the delay measurement device 130.

It should be noted that by setting the transporting delay T4 to be equal to an average of the transporting delays T0 and T1, and through the arithmetic operation of the equations (3) and (4), the transporting delay of the tested transporting conductive wire is Ttsv2=(T2+T3−T4)/2. Namely, by transmitting the transporting delays T0-T3 to the controller 140, the controller 140 may simply calculate the transporting delay of the tested transporting conductive wire (the transporting conductive wire TSV2).

Figure 2:
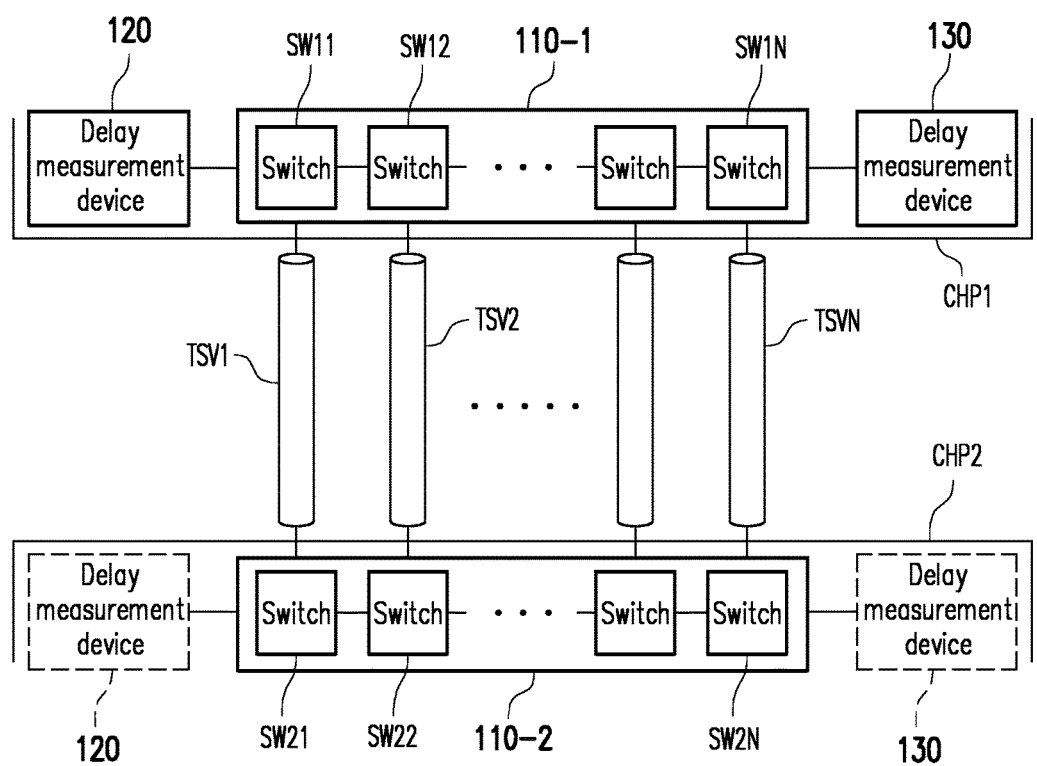
FIG. 2 is a schematic diagram of an implementation of the delay measurement circuit of one of the embodiments of FIG. 1A to FIG. 1C.

Referring to FIG. 2, FIG. 2 is a schematic diagram of an implementation of one of the delay measurement circuits of the embodiments of FIG. 1A to FIG. 1C. In FIG. 2, the transporting path selector 110-1 includes a plurality of switches SW11-SW1N, and the transporting path selector 110-2 includes a plurality of switches SW21-SW2N. The switches SW11-SW1N are respectively coupled to the first ends of the transporting wires TSV1-TSVN, and the switches SW21-SW2N are respectively coupled to the second ends of the transporting wires TSV1-TSVN. The switches SW11-SW1N and the switches SW21-SW2N are switched according to the control signal to change a connection relationship between the transporting conductive wires TSV1-TSVN, such that the transporting conductive wires TSV1-TSVN may produce a plurality of different transporting loops between the delay measurement devices 120 and 130, wherein the transporting loops of the present embodiment are through two transporting conductive wires in the transporting conductive wires TSV1-TSVN.

On the other hand, the transporting conductive wires TSV1-TSVN can be used for connecting a chip CHP1 and a chip CHP2. In the present embodiment, the first ends of the transporting conductive wires TSV1-TSVN and the transporting path selector 110-1 are disposed in the chip CHP1, and the second ends of the transporting conductive wires TSV1-TSVN and the transporting path selector 110-2 are disposed in the chip CHP2. It should be noted that the delay measurement devices 120 and 130 can be commonly disposed in the chip CHP1 at two sides adjacent to the transporting conductive wires TSV1 and TSVN and are coupled to the two ends of the transporting path selector 110-1. Alternatively, the delay measurement devices 120 and 130 can be commonly disposed in the chip CHP2 at two sides adjacent to the transporting conductive wires TSV1 and TSVN and are coupled to the two ends of the transporting path selector 110-2. Alternatively, the delay measurement devices 120 and 130 can be respectively disposed in the chip CHP1 (CHP2) and CHP2 (CHP1) at two sides adjacent to the transporting conductive wires TSV1 and TSVN, where the chips in which the delay measurement devices 120 and 130 are disposed are not particularly specified.

Similar to the delay measurement devices 120 and 130, a configuration position of the controller 140 is not particularly specified.

In the present embodiment, implementation details of the switches SW11-SW1N and the switches SW21-SW2N are not particularly specified, and any device that can be used as the switches and are well known by those skilled in the art can be adopted.

On the other hand, the transporting conductive wires TSV1-TSVN can be conductive wires formed by through silicon vias, or can be bonding wires, or a combination thereof.

Figure 3:
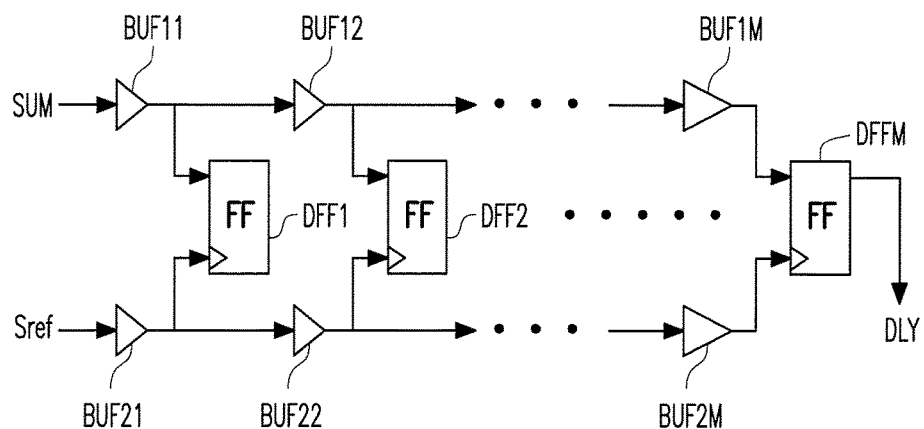
FIG. 3 is a schematic diagram of an implementation of a delay measurement device according to an embodiment of the invention.

Referring to FIG. 3, FIG. 3 is a schematic diagram of an implementation of a delay measurement device according to an embodiment of the invention. The delay measurement device 300 includes first buffers BUF11-BUF1M, second buffers BUF21-BUF2M and flip-flops DFF1-DFFM. The first buffers BUF11-BUF1M are coupled to each other in series. The first buffer BUF11 receives a tested signal SUM, and the first buffers BUF11-BUF1M generate a plurality of delayed tested signals by sequentially delaying the tested signal SUM. The second buffers BUF21-BUF2M are coupled to each other in series. The second buffer BUF21 receives a reference signal Sref, and the second buffers BUF21-BUF2M generate a plurality of delayed reference signals by sequentially delaying the reference signal Sref, where the tested signal SUM is obtained through one of the transporting loops in the aforementioned embodiment.

The flip-flops DFF1-DFFM respectively receive the delayed tested signals and the delayed reference signals. Each of the flip-flops DFF1-DFFM samples the corresponding delayed tested signal according to the received delayed reference signal to generate a transporting delay DLY corresponding to each of the transporting loops.

In the present embodiment, a resolution of the transporting delay DLY can be set according to a delay magnitude of the first buffers BUF11-BUF1M and the second buffers BUF21-BUF2M, and a detection range of the transporting delay DLY can be set according to a number of the first buffers BUF11-BUF1M and the second buffers BUF21-BUF2M.

Figure 4:
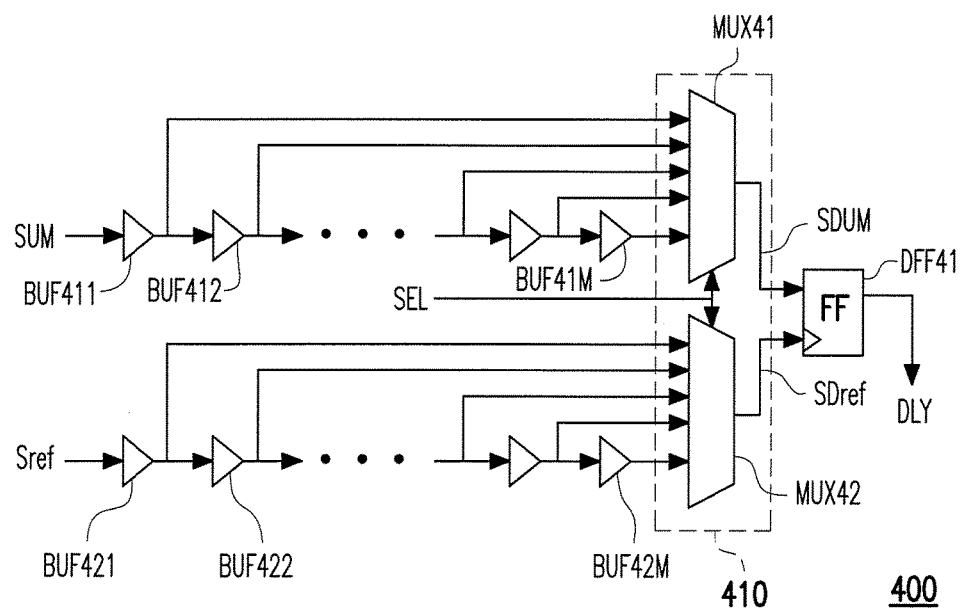
FIG. 4 is a schematic diagram of another implementation of a delay measurement device according to an embodiment of the invention.

Referring to FIG. 4, FIG. 4 is a schematic diagram of another implementation of a delay measurement device according to an embodiment of the invention. The delay measurement device 400 includes first buffers BUF411-BUF41M, second buffers BUF421-BUF42M, a multiplexer 410 and a flip-flop DFF41. The first buffers BUF411-BUF41M are coupled to each other in series, the first buffer BUF411 receives the tested signal SUM, and the first buffers BUF411-BUF41M generate a plurality of delayed tested signals by sequentially delaying the tested signal SUM. The second buffers BUF421-BUF42M are coupled to each other in series. The second buffer BUF421 receives the reference signal Sref, and the second buffers BUF421-BUF42M generate a plurality of delayed reference signals by sequentially delaying the reference signal Sref, where the tested signal SUM is obtained through one of the transporting loops in the aforementioned embodiment.

The multiplexer 410 includes multiplexing circuits MUX41 and MUX42. The multiplexing circuit MUX41 receives the delayed tested signals, and the multiplexing circuit MUX42 receives the delayed reference signals. The multiplexing circuits MUX41 and MUX 42 further receive a selection signal SEL, and sequentially select each of the delayed tested signals and the corresponding delayed reference signal according to the selection signal SEL to respectively generate a selected delayed tested signal SDUM and a selected delayed reference signal SDref. In detail, when the multiplexing circuit MUX41 selects the delayed tested signal generated by the first buffer BUF411 to generate the selected delayed tested signal SDUM, the multiplexing circuit MUX42 correspondingly selects the delayed reference signal generated by the second buffer BUF421 to generate the selected delayed reference signal SDref. Then, the multiplexing circuit MUX41 selects the delayed tested signal generated by the first buffer BUF412 to generate the selected delayed tested signal SDUM, and the multiplexing circuit MUX42 correspondingly selects the delayed reference signal generated by the second buffer BUF422 to generate the selected delayed reference signal SDref, and the others are deduced by analogy.

The flip-flop DFF41 can be a D-type flip-flop, and receives the selected delayed reference signal SDref and the selected delayed tested signal SDUM, and samples the selected delayed tested signal SDUM according to the selected delayed reference signal SDref to obtain the transporting delay DLY corresponding to each of the transporting loops.

Similar to the aforementioned embodiment, the resolution of the transporting delay DLY can be set according to a delay magnitude of the first buffers BUF411-BUF41M and the second buffers BUF421-BUF42M, and the detection range of the transporting delay DLY can be set according to a number of the first buffers BUF411-BUF41M and the second buffers BUF421-BUF42M.

Figure 5:
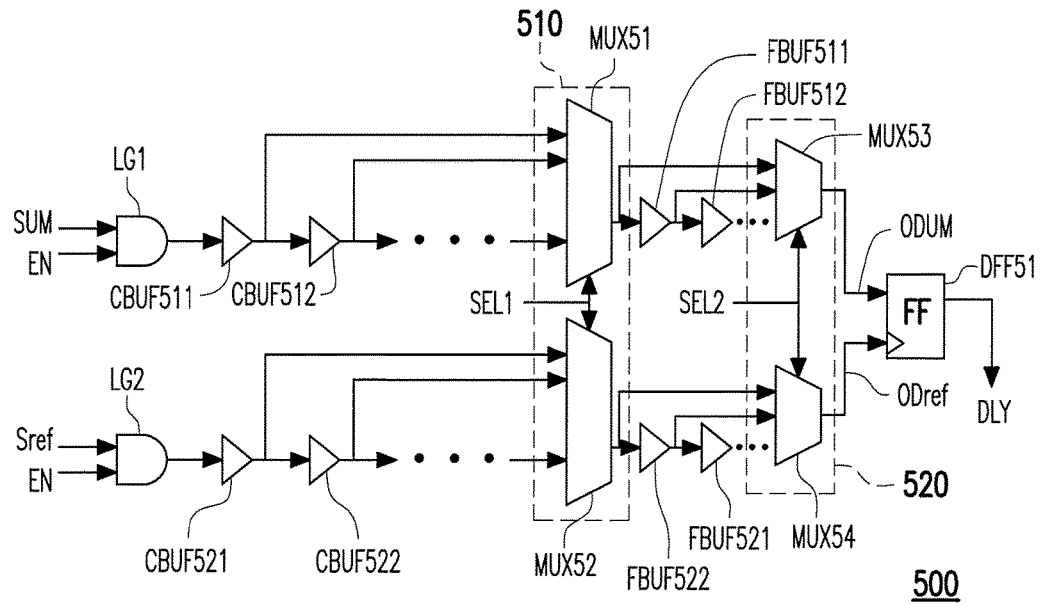
FIG. 5 is a schematic diagram of another implementation of a delay measurement device according to an embodiment of the invention.

Referring to FIG. 5, FIG. 5 is a schematic diagram of another implementation of a delay measurement device according to an embodiment of the invention. The delay measurement device 500 includes first coarse buffers CBUF511-BUF512, second coarse buffers CBUF521-BUF522, first fine buffers FBUF511-FBUF512, second fine buffers FUF521-FBUF522, multiplexers 510, 520 and a flip-flop DFF51. The first coarse buffers CBUF511-CBUF512 are coupled to each other in series, the first coarse buffer CBUF511 receives the tested signal SUM through a logic gate LG1, and the first coarse buffers CBUF511-CBUF512 generate a plurality of coarse delayed tested signals by sequentially delaying the tested signal SUM. The second coarse buffers CBUF521-CBUF522 are coupled to each other in series. The second coarse buffer CBUF521 receives the reference signal Sref through a logic gate LG2, and the second coarse buffers CBUF521-CBUF522 generate a plurality of coarse delayed reference signals by sequentially delaying the reference signal Sref, where the tested signal SUM is obtained through one of the transporting loops in the aforementioned embodiment.

The multiplexer 510 includes multiplexing circuits MUX51 and MUX52. The multiplexing circuit MUX51 receives the coarse delayed tested signals, and the multiplexing circuit MUX52 receives the coarse delayed reference signals. The multiplexing circuits MUX51 and MUX 52 further receive a selection signal SEL1, and sequentially select each of the coarse delayed tested signals and the corresponding coarse delayed reference signal according to the selection signal SEL1 to respectively generate a selected delayed tested signal and a selected delayed reference signal.

The first fine buffers FBUF511-FBUF512 are coupled to each other in series, the first fine buffer FBUF511 receives the selected delayed tested signal, and the first fine buffers FBUF511-FBUF512 generate a plurality of fine delayed tested signals by sequentially delaying the selected delayed tested signal. The second fine buffers FBUF521-FBUF522 are coupled to each other in series, the second fine buffer FBUF521 receives the selected delayed reference signal, and the second fine buffers FBUF521-FBUF522 generate a plurality of fine delayed reference signals by sequentially delaying the selected delayed reference signal.

The multiplexer 520 receives the fine delayed tested signals and the fine delayed reference signals, and sequentially selects each of the fine delayed tested signals and the corresponding fine delayed reference signal according to a selection signal SEL2 to respectively generate an output delayed tested signal ODUM and an output delayed reference signal ODref.

The flip-flop DFF51 can be a D-type flip-flop, and receives output delayed reference signal ODref and the output delayed tested signal ODUM, and samples the output delayed tested signal ODUM according to the output delayed reference signal ODref to obtain the transporting delay DLY corresponding to each of the transporting loops.

It should be noted that in the present embodiment, a delay amount of each of the first fine buffers FBUF511-FBUF512 is smaller than a delay amount of each of the first coarse buffers CBUF511-CBUF512, and a delay amount of each of the second fine buffers FBUF521-FBUF522 is smaller than a delay amount of each of the second coarse buffers CBUF521-CBUF522.

It should be noted that the logic gates LG1 and LG2 are AND gates in the present embodiment. The logic gate LG1 receives the tested signal SUM and an enable signal EN, and the logic gate LG2 receives the reference signal Sref and the enable signal EN. Moreover, when the enable signal EN has a logic high level, the tested signal SUM and the reference signal Sref may respectively pass through the logic gates LG1 and LG2 for being transmitted to internal of the delay measurement device 500 to implement a delay measurement operation.

Figure 6:
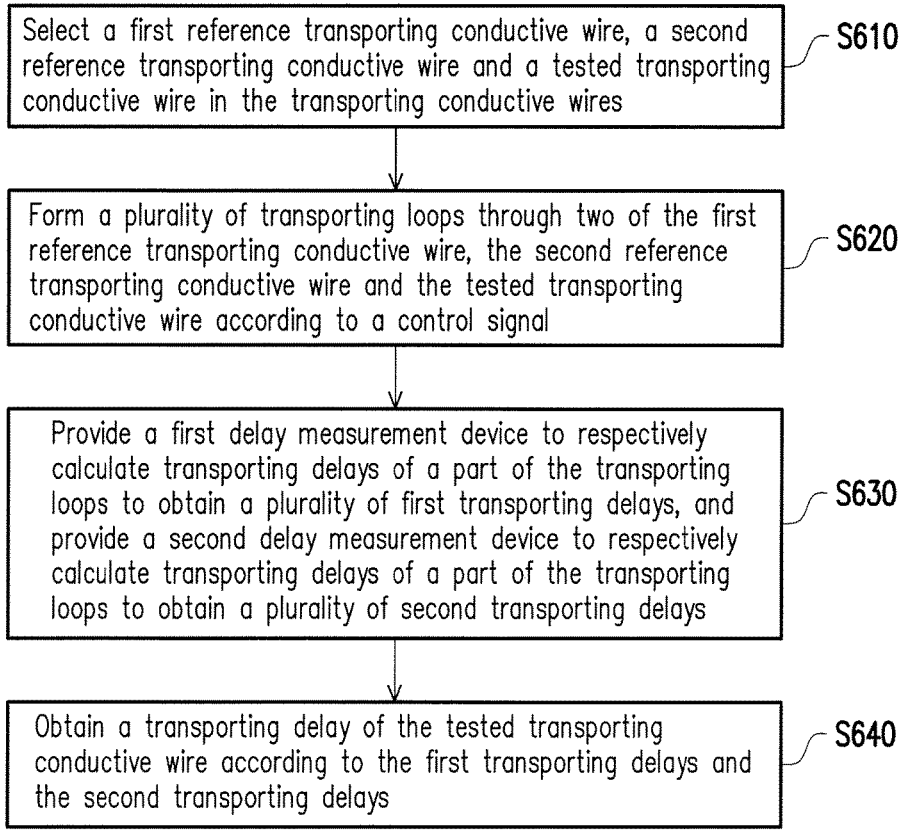
FIG. 6 is a flowchart illustrating a measuring method of delay of transporting conductive wires according to an embodiment of the invention.

Referring to FIG. 6, FIG. 6 is a flowchart illustrating a measuring method of delay of transporting conductive wires according to an embodiment of the invention. The tested transporting conductive wires are connected to a first chip and a second chip, and the measuring method includes following steps. In step S610, a first reference transporting conductive wire, a second reference transporting conductive wire and a tested transporting conductive wire in the transporting conductive wires are selected.

In step S620, a plurality of transporting loops through two of the first reference transporting conductive wire, the second reference transporting conductive wire and the tested transporting conductive wire is formed according to a control signal. In step S630, a first delay measurement device is provided to respectively calculate transporting delays of a part of the transporting loops to obtain a plurality of first transporting delays, and a second delay measurement device is provided to respectively calculate transporting delays of a part of the transporting loops to obtain a plurality of second transporting delays. In step S640, a transporting delay of the tested transporting conductive wire is obtained according to the first transporting delays and the second transporting delays.

Operation details of the implantations of the above steps have been described in detail in the aforementioned embodiments and implementations, and detail thereof is not repeated.

In summary, in the invention, by measuring the transporting delays of a plurality of transporting loops formed by the transporting conductive wires, an arithmetic operation method is adopted to obtain the transporting delay of the tested transporting conductive wire. The influence on the transporting delay caused by a manufacturing process variation is mitigated, and measurement accuracy is improved. Moreover, the delay measurement devices are set on the chips to implement measurement operations in real-time. In addition, the invention provides a plurality of structures of the delay measurement devices, a resolution and a range of delay measurement are enhanced to provide diversified applications.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A delay measurement circuit, comprising:
a transporting path selector, coupled to a plurality of transporting conductive wires, selecting a first reference transporting conductive wire, a second reference transporting conductive wire and a tested transporting conductive wire in the transporting conductive wires, and forming a first transporting loop, a second transporting loop and a third transporting loop according to a control signal, wherein the first transporting loop passes through the first reference transporting conductive wire and the second reference transporting conductive wire, the second transporting loop passes through the first reference transporting conductive wire and the tested transporting conductive wire, and the third transporting loop passes through the second reference transporting conductive wire and the tested transporting conductive wire;
a first delay measurement device, directly coupled to one end of the transporting path selector, and detecting transporting delays of the first transporting loop and the second transporting loop to respectively obtain the first transporting delays T0 and T2;
a second delay measurement device, directly coupled to another end of the transporting path selector, and detecting transporting delays of the first transporting loop and the third transporting loop to respectively obtain the second transporting delays T1 and T3; and
a controller, coupled to the transporting path selector, the first delay measurement device and the second delay measurement device, and generating the control signal, wherein the controller is configured to perform an arithmetic operation to obtain a transporting delay of the tested transporting conductive wire according to the first transporting delays T0 and T2 and the second transporting delays T1 and T3,
wherein the transporting delay of the tested transporting conductive wire=(T2+T3−T4)/2, and T4 is an average of T0 and T1.

2. The delay measurement circuit as claimed in claim 1, wherein the transporting path selector comprises a plurality of first switches and a plurality of second switches, the first switches are respectively coupled to first ends of the transporting conductive wires, and the second switches are respectively coupled to second ends of the transporting conductive wires.

3. The delay measurement circuit as claimed in claim 2, wherein the first ends of the transporting conductive wires are coupled to a first chip, the second ends of the transporting conductive wires are coupled to a second chip, the first switches are configured in the first chip, and the second switches are configured in the second chip.

4. The delay measurement circuit as claimed in claim 3, wherein the first delay measurement device is disposed in the first chip or the second chip, and the second delay measurement device is disposed in the first chip or the second chip.

5. The delay measurement circuit as claimed in claim 1, wherein one of the first delay measurement device and the second delay measurement device comprises:

a plurality of first coarse delay adjusting circuits for coarsely tuning a delay amount, coupled to each other in series, and receiving a tested signal through each of the transporting loops to generate a plurality of coarse delayed tested signals;

a plurality of second coarse delay adjusting circuits for coarsely tuning a delay amount, coupled to each other in series, and receiving a reference signal to generate a plurality of coarse delayed reference signals;

a first multiplexer, receiving the coarse delayed tested signals and the coarse delayed reference signals, and sequentially selecting each of the coarse delayed tested signals and the corresponding coarse delayed reference signal according to a first selection signal to respectively generate a selected delayed tested signal and a selected delayed reference signal;

a plurality of first fine delay adjusting circuits for finely tuning a delay amount, coupled to each other in series, and receiving the selected delayed tested signal to generate a plurality of fine delayed tested signals;

a plurality of second fine delay adjusting circuits for finely tuning a delay amount, coupled to each other in series, and receiving the selected delayed reference signal to generate a plurality of fine delayed reference signals;

a second multiplexer, receiving the fine delayed tested signals and the fine delayed reference signals, and sequentially selecting each of the fine delayed tested signals and the corresponding fine delayed reference signal according to a second selection signal to respectively generate an output delayed tested signal and an output delayed reference signal; and a flip-flop, sequentially sampling the output delayed tested signal according to the output delayed reference signal to obtain the transporting delay of each of the transporting loops.

6. The delay measurement circuit as claimed in claim 1, wherein each of the transporting conductive wires is a bonding wire.

7. The delay measurement circuit as claimed in claim 1, wherein each of the transporting conductive wires is a through silicon via.

8. A measuring method of delay of transporting conductive wires, wherein the transporting conductive wires are connected to a first chip and a second chip, the measuring method of delay of the transporting conductive wires comprising:

selecting a first reference transporting conductive wire, a second reference transporting conductive wire and a tested transporting conductive wire in the transporting conductive wires;

forming a first transporting loop, a second transporting loop and a third transporting loop according to a control signal, wherein the first transporting loop passes through the first reference transporting conductive wire and the second reference transporting conductive wire, the second transporting loop passes through the first reference transporting conductive wire and the tested transporting conductive wire, and the third transporting loop passes through the second reference transporting conductive wire and the tested transporting conductive wire;

providing a first delay measurement device to detect transporting delays of the first transporting loop and the second transporting loop to respectively obtain the first transporting delays T0 and T2, and providing a second delay measurement device to detect transporting delays of the first transporting loop and the third transporting loop to respectively obtain the second transporting delays T1 and T3; and performing an arithmetic operation to obtain a transporting delay of the tested transporting conductive wire according to the first transporting delays T0 and T2 and the second transporting delays T1 and T3, wherein the transporting delay of the tested transporting conductive wire=$(T2+T3-T4)/2$ and T4 is an average of T0 and T1.

* * * * *